(12) United States Patent
Mininni et al.

(10) Patent No.: US 12,266,677 B2
(45) Date of Patent: Apr. 1, 2025

(54) LOW STRESS DIE ATTACHMENT FOR THERMAL IMAGING FOCAL PLANE ARRAYS

(71) Applicant: Seek Thermal, Inc., Goleta, CA (US)

(72) Inventors: Lars Mininni, Santa Barbara, CA (US); Shawn Dirksen, Santa Barbara, CA (US); Thad Miller, Santa Barbara, CA (US)

(73) Assignee: Seek Thermal, Inc., Goleta, CA (US)

( * ) Notice: Subject to any disclaimer, the term of this patent is extended or adjusted under 35 U.S.C. 154(b) by 492 days.

(21) Appl. No.: 17/576,296

(22) Filed: Jan. 14, 2022

(65) Prior Publication Data

US 2022/0231059 A1 Jul. 21, 2022

Related U.S. Application Data

(60) Provisional application No. 63/137,994, filed on Jan. 15, 2021.

(51) Int. Cl.
*H01L 27/146* (2006.01)
*H01L 21/60* (2006.01)
*H01L 31/18* (2006.01)
*H04N 5/33* (2023.01)
*H04N 23/55* (2023.01)

(52) U.S. Cl.
CPC .......... *H01L 27/1469* (2013.01); *H01L 21/60* (2021.08); *H01L 27/14649* (2013.01); *H01L 31/18* (2013.01); *H04N 5/33* (2013.01); *H04N 23/55* (2023.01)

(58) Field of Classification Search
CPC .......... H01L 27/14649; H01L 24/32
See application file for complete search history.

(56) References Cited

U.S. PATENT DOCUMENTS

| 9,056,764 | B2 | 6/2015 | Tarn | |
| 2008/0231946 | A1* | 9/2008 | Scott | G01J 3/36 427/457 |
| 2015/0362374 | A1 | 12/2015 | Wheeler et al. | |
| 2016/0097681 | A1 | 4/2016 | Buchan et al. | |
| 2018/0180485 | A1 | 6/2018 | Ross et al. | |
| 2021/0063244 | A1 | 3/2021 | Parrish et al. | |

FOREIGN PATENT DOCUMENTS

| CN | 109297606 A | 2/2019 |
| WO | WO 2018/237079 A1 | 12/2018 |
| WO | WO 2021/041717 A1 | 3/2021 |

* cited by examiner

*Primary Examiner* — Yu-Hsi D Sun
(74) *Attorney, Agent, or Firm* — Knobbe, Martens, Olson & Bear, LLP

(57) ABSTRACT

Devices and methods that result in very low stress circuit die attachment to substrates such as PCB's and flex circuits are described. Stress, due to thermal expansion mismatches, is reduced by reducing the amount of die bonding area that is covered by adhesive material. In some instances, the area left uncovered by adhesive material may be all or partially filled with a low viscosity material that may also be thermally conductive, such as thermal grease. Reducing the contact area between the die and inherently low elasticity adhesives reduces the mechanical effect of thermal mismatches between the die and the substrate. The provided techniques are particularly beneficial when used to bond uncooled thermal imaging FPA dies to substrates.

17 Claims, 3 Drawing Sheets

LOW STRESS DIE ATTACHMENT FOR THERMAL IMAGING FOCAL PLANE ARRAYS

CROSS-REFERENCE TO RELATED APPLICATIONS

This application claims the benefit of U.S. Provisional Application Ser. No. 63/137,994, filed Jan. 15, 2021, titled "LOW STRESS DIE ATTACHMENT FOR THERMAL IMAGING FOCAL PLANE ARRAYS," the entirety of which is incorporated by reference herein.

FIELD

The present disclosure generally relates to circuit die/substrate assemblies, and in particular to low stress die substrate bonding including thermal imaging Focal Plane Array (FPA) dies.

BACKGROUND

The increasing availability of high-performance, low-cost, uncooled thermal imaging devices, such as those based on bolometer focal plane arrays (FPAs), is enabling the design and production of mass-produced thermal imaging sensors. Long-term stability and performance of such mass-produced sensors could be improved by new assembly techniques to reduce sensor variability due to ambient temperature changes.

SUMMARY

The methods and devices of this disclosure each have several innovative aspects, no single one of which is solely responsible for its desirable attributes. Without limiting the scope as expressed by the claims that follow, its more prominent features will now be discussed briefly.

In a first aspect, a method for attaching an integrated circuit die to a substrate comprises applying an adhesive in a pattern to at least one of a back surface of the die or an area of the substrate to which the die is to be attached, and assembling the die and the substrate together by at least compressing and curing the adhesive. When the adhesive is fully compressed and cured, the adhesive covers less than 25% by area of the back surface of the die.

In some embodiments, the adhesive covers less than 10% by area of the back surface of the die. In some embodiments, the adhesive covers less than 5% by area of the back surface of the die.

In some embodiments, the adhesive is a thermally conductive adhesive.

In some embodiments, the adhesive pattern is at least one of: one dot of adhesive in a center region of the back surface or of the area of the substrate to which the die is to be attached; one dot of adhesive in each of two opposite corner regions of the back surface or of the area of the substrate to which the die is to be attached; one dot of adhesive in each of four corner regions of the back surface or of the area of the substrate to which the die is to be attached; or one or more lines of adhesive disposed along one or more edges of the back surface or of the area of the substrate to which the die is to be attached.

In some embodiments, the method further comprises applying, prior to assembling the die and the substrate together, a viscous thermally conductive material to at least one of the back surface of the die or the area of the substrate to which the die is to be attached, wherein assembling the die and the substrate together further comprises at least compressing the viscous thermally conductive material, and wherein, when the viscous thermally conductive material is fully compressed, the viscous thermally conductive material fills at least part of the space between the die and the substrate. In some embodiments, the viscous thermally conductive material is at least one of a thermal grease, a thermal paste, one or more gap filler pads, thermal tape, a heat-transfer compound.

In some embodiments, the die is a thermal imaging focal plane array (FPA).

In a second aspect, a device comprising an integrated circuit die attached to a substrate is produced by at least applying an adhesive in a pattern to at least one of a back surface of the die or an area of the substrate to which the die is to be attached, and assembling the die and the substrate together by at least compressing and curing the adhesive. When the adhesive is fully compressed and cured, the adhesive covers less than 25% by area of the back surface of the die.

In some embodiments, the adhesive covers less than 10% by area of the back surface of the die. In some embodiments, the adhesive covers less than 5% by area of the back surface of the die.

In some embodiments, the adhesive is a thermally conductive adhesive.

In some embodiments, the adhesive pattern is at least one of: one dot of adhesive in a center region of the back surface or of the area of the substrate to which the die is to be attached; one dot of adhesive in each of two opposite corner regions of the back surface or of the area of the substrate to which the die is to be attached; one dot of adhesive in each of four corner regions of the back surface or of the area of the substrate to which the die is to be attached; or one or more lines of adhesive disposed along one or more edges of the back surface or of the area of the substrate to which the die is to be attached.

In some embodiments, the device is further produced by at least applying, prior to assembling the die and the substrate together, a viscous thermally conductive material to at least one of the back surface of the die or the area of the substrate to which the die is to be attached, wherein assembling the die and the substrate together further comprises the viscous thermally conductive material, and wherein, when the viscous thermally conductive material is fully compressed, the viscous thermally conductive material fills at least part of the space between the die and the substrate. In some embodiments, the viscous thermally conductive material is a thermal grease.

In some embodiments, the die is a thermal imaging focal plane array (FPA).

In a third aspect, an imaging device comprises a substrate, a focal plane array (FPA) die, and a cured adhesive adhering the FPA die to the substrate. The cured adhesive is disposed between the substrate and the FPA die and covers less than 25% of a substrate-facing surface of the FPA die.

In some embodiments, the cured adhesive covers less than 5% of the substrate-facing surface of the FPA die.

In some embodiments, the cured adhesive is disposed in a pattern comprising one or more dots.

In some embodiments, the imaging device further comprises a viscous, thermally conductive, non-adhesive material disposed within at least a portion of a space between the FPA die and the substrate not occupied by the cured adhesive.

BRIEF DESCRIPTION OF THE DRAWINGS

The above-mentioned aspects, as well as other features, aspects, and advantages of the present technology will now be described in connection with various implementations, with reference to the accompanying drawings. The illustrated implementations are merely examples and are not intended to be limiting. \Throughout the drawings, similar symbols typically identify similar components, unless context dictates otherwise.

DETAILED DESCRIPTION

The following description is directed to certain implementations for the purpose of describing the innovative aspects of this disclosure. However, a person having ordinary skill in the art will readily recognize that the teachings herein can be applied in a multitude of different ways.

Generally described, embodiments of the present disclosure relate to reduction of stress resulting from thermal mismatches or post-cure adhesive creep between circuit dies bonded to substrates, and other components coupled to the die/substrate or the substrate itself. Devices and methods may be provided that result in very low-stress circuit die attachment to substrates such as PCBs, flex circuits, and the like. In some embodiments, stress due to thermal expansion mismatches or post-cure adhesive creep can be reduced by reducing the amount of die bonding area that is covered by adhesive material. In some instances, the area left uncovered by adhesive material may be all or partially filled with a material that may also be thermally conductive, such as heat-spreading thermal grease. Reducing the contact area between the die and inherently low-elasticity adhesives can advantageously reduce the mechanical effect of thermal mismatches or post-cure adhesive creep between the die and the substrate. The provided techniques may be particularly beneficial in the context of imaging devices, such as thermal imaging devices, when used to bond uncooled thermal imaging FPA dies to substrates. However, the present technology may equally be applied to achieve improved bonding characteristics between circuit dies and substrates in a variety of other implementations without departing from the scope of the present disclosure.

Figure 1:
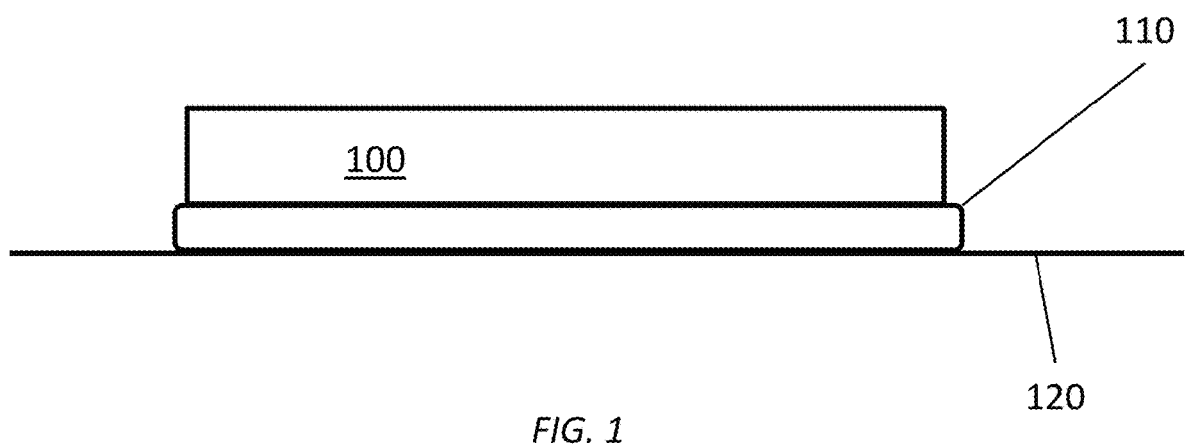
FIG. 1 shows an exemplary conventional arrangement for bonding die to a substrate.

Dies are typically bonded to substrates as shown in FIG. 1. A die 100 is bonded to a substrate 120 by way of a die attach material 110, often a thermally conductive (and often electrically insulative) adhesive. In order to achieve a reliable bond, the die attach material 110 is usually spread over all or most of the die attachment area on the back of the die 100. As shown in FIG. 1, the die attach material 110 may frequently cover the full back (e.g., substrate-facing) surface of the die 100.

In general, when bonding a circuit die 100 to a substrate 120, even if the substrate 120 itself and the die attach material 110 are well matched thermally to the circuit die 100, the substrate 120 in turn may be mechanically mated to other materials. For example, a silicon circuit may be bonded to a silicon substrate, but that substrate may in turn be bonded to another substrate such as a flex circuit PCB. As the bonded die experiences temperature swings due to both ambient and operationally induced temperature changes, any thermal expansion mismatches are coupled to the die through the adhesive attachment. Such mismatches result in stresses applied to the die. While a uniform adhesive coating as shown in FIG. 1 results in mechanical stability and uniform attachment forces, this arrangement also maximizes the stress coupling area.

The adhesive properties of die attach materials, also referred to herein as adhesives, are typically chosen to provide adequate mechanical coupling, so they tend to be inherently low-elasticity materials and therefore some stress coupling will occur between the substrate and die. Either by thermal matching or low thermal expansion properties, the adhesives may be chosen to not generate stresses large enough to damage or negatively affect performance for many circuit applications. However, many circuit types are especially sensitive and thus may still experience undesirable thermal mismatch stresses due to the unavoidable residual stresses imparted to the die even for a well-designed conventional die attachment protocol.

An example of a particularly sensitive circuit die is an FPA for an uncooled thermal imager. The sensors for such imagers are often devices such as microbolometers. A microbolometer is a very small micro-machined mechanical structure that is extremely sensitive to mechanical stress. Microbolometer response to thermal radiation changes as both a function of observed scene temperature (e.g., the observed scene signal of interest) as well as ambient temperature, the response to which is a signal degradation effect.

In some cases, these response variations can be partially calibrated out by testing imagers over a range of scene and ambient temperatures and mapping the response variations. However, it has been observed that as a bonded die and the components attached to it experience temperature changes, the response of the microbolometer sensors will vary due to induced mechanical stress as well, and this variation is not constant over time, and thus cannot be removed through calibration. This stress-related effect is not predictable as its behavior is a function of one or more unknown input factors, such as cumulative operating temperature history. For most thermal imagers, an ability to periodically correct for non-uniformity shifts over time is provided by an ability to periodically expose the sensor to a uniform scene, such as by using a shutter. However, for many small, inexpensive thermal imaging sensors, it is desirable to operate without the need for the complexity and cost of including a uniformity correction device such as a shutter. Such shutterless sensors are described in U.S. application Ser. No. 16/623,751, filed Dec. 17, 2019, titled "Design, Test, and Operation of a Small Thermal Imaging Core," which is incorporated by reference in its entirety. As shown in the incorporated reference, the FPA die is bonded conventionally to a silicon substrate which is in turn bonded to a flex circuit. Stress-related response errors over time have been observed for this imager in some instances. For shutterless thermal imaging, it may be desirable to reduce the stress-induced unpredictable response variations by reducing the coupled stress.

Figure 2A:
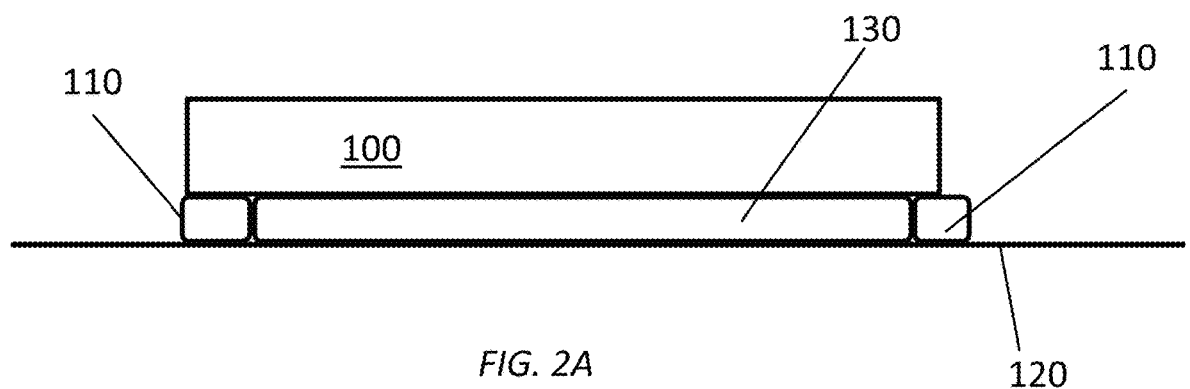
FIGS. 2A and 2B show two views of an exemplary embodiment of the low stress bonding technique.

FIG. 2A schematically illustrates an embodiment of a reduced-stress die bonding approach in accordance with the present technology. An FPA imager is shown and discussed as the die 100, but it should be understood that the teachings herein may apply to any die bonding application. In this case, rather than apply enough adhesive die attach material 110 to cover all or most of the backside bonding area of the die 100, the adhesive 110 is applied to a portion of the bonding area (either to the die 100, the substrate 120, or both) in a dot or pattern of dots. The total volume of the dots is chosen based on criteria that will vary with the type of die and substrate as well as the environmental conditions the imager will be exposed to in use. These criteria include the mechanical parameters (weight, dimension, material properties etc.) of the die and other components, as well as the environmental requirements the die will experience, determined from the temperature range, vibration and shock specifications of the imaging system worked back to the die bond. A minimum volume of die attach material 110 can be determined by how much adhesive, spread over the area achieved when the die 100 and substrate 120 have been assembled together with the adhesive compressed and cured, is required to provide adequate reliable mechanical adhesion of the die 100 to the substrate 120 given the environmental specifications of the system the die 100 is installed in.

In some embodiments, the portion of the total die area (e.g., the portion of the total area of the substrate-facing backside of the die 100) covered by the die attach material may be as low as 25%, 10%, 5%, or less of the total die area. An adhesive or die attach material 110 may be chosen that will meet the above criteria for mechanical adhesion when the total adhesive covered bond area is less than 25% of the total die area. If possible, even lower area percentages, such as less than 10% or even 5% are desirable if the mechanical criteria can be met. The result of the greatly reduced contact area is less mismatch or post-cure creep induced stress coupled to the die 100.

It is also possible to apply a viscous material 130 to the die 100, substrate 120, or both, such that when assembled (e.g., compressed) the viscous material fills all or part of the space between the die and substrate not covered with adhesive. It is desirable to pick a material that will couple minimal stress and may also be thermally conductive and electrically insulative. In some embodiments, the viscous material 130 may be non-adhesive. One non-limiting example of a suitable viscous material is a thermal grease such as that produced by Loctite Dupont.

Figure 2B:
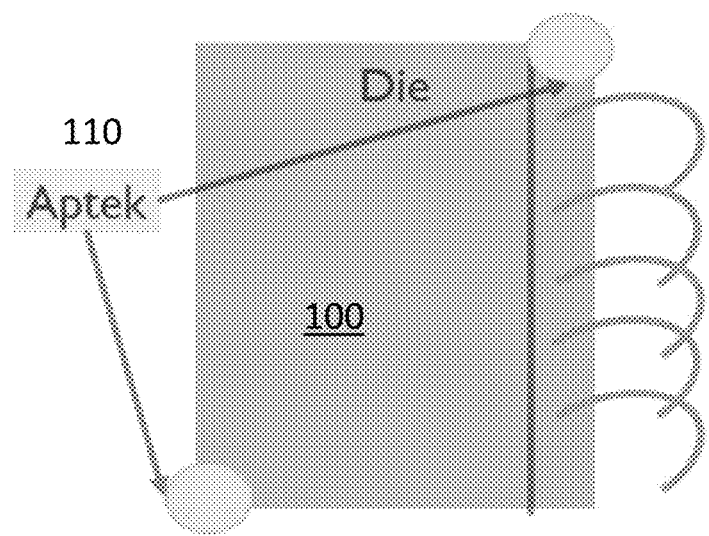

The example embodiment shown in FIGS. 2A and 2B shows an adhesive material Aptek, by way of example, applied in two dots 110 in opposite corner regions of the die 100, with a thermal grease fill 130. For a thermal imager of a shutterless microcore type intended for systems meeting industrial environmental specifications, the two dots' volume was chosen to result in less than 5% of the die area when fully assembled and cured. The decreased stress-coupling area compared to conventional bonding approaches achieved significant reduction of stress-induced response errors while maintaining adequate mechanical integrity.

Figure 3A:
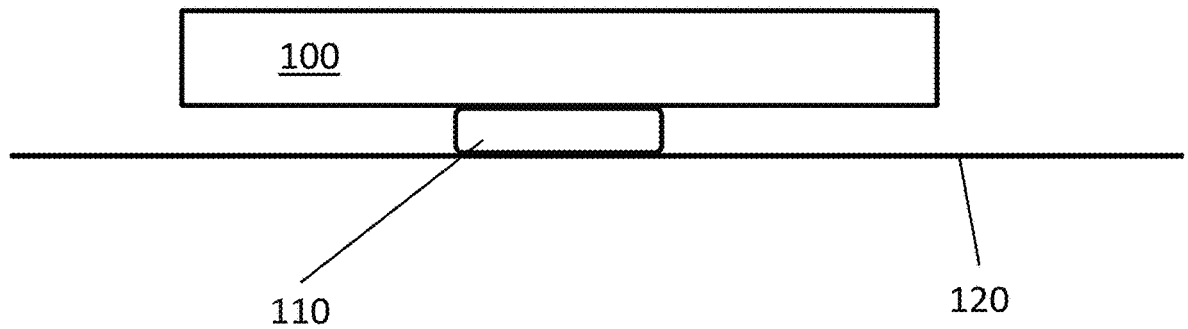
FIGS. 3A and 3B show two alternative exemplary embodiments of the low stress bonding technique.
Figure 3B:
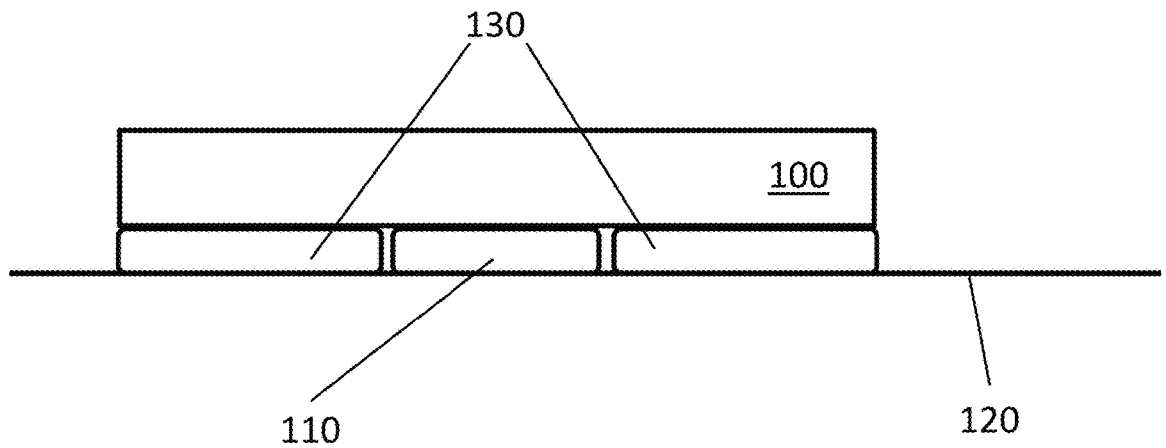

Other adhesive patterns are possible, both with and without viscous fill material. FIGS. 3A and 3B show a one-dot adhesive pattern of die attach material, applied in a center region of the backside of the die 100, both with a viscous material 130 fill (FIG. 3B) and without a viscous material 130 fill (FIG. 3A). In other example embodiments, three or four dots in corner regions of the die 100 are also a possibility, as well as any other patterns of dots at corners, along edges, in a center, or in intermediate portions of the backside of the die 100, in any combination, size, and/or arrangement that meet the area/mechanical integrity requirements for a given application. Moreover, other patterns may include shapes other than dots, such as circles, lines, irregular shapes, etc. In some embodiments, the adhesive pattern may include one or more lines such as two lines disposed along opposing edges of the die or to the substrate area where the die will be attached, or more lines disposed along a full or substantially full perimeter of the die or of the region of the substrate to which the die will be attached.

Depending on the embodiment, certain acts, events, or functions of any of the processes described herein can be performed in a different sequence, can be added, merged, or left out altogether (e.g., not all described acts or events are necessary for the practice of the method).

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements, and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. The terms "comprising," "including," "having," "involving," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Disjunctive language such as the phrase "at least one of X, Y, and Z," unless specifically stated otherwise, is otherwise understood with the context as used in general to present that an item, term, etc., may be either X, Y or Z, or any combination thereof (e.g., X, Y and/or Z). Thus, such disjunctive language is not generally intended to, and should not, imply that certain embodiments require at least one of X, at least one of Y or at least one of Z to each be present.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

While the above detailed description has shown, described, and pointed out novel features as applied to illustrative embodiments, it will be understood that various omissions, substitutions, and changes in the form and details of the devices or processes illustrated can be made without departing from the spirit of the disclosure. As will be recognized, certain embodiments described herein can be embodied within a form that does not provide all of the features and benefits set forth herein, as some features can be used or practiced separately from others. All changes which come within the meaning and range of equivalency of the claims are to be embraced within their scope.

What is claimed is:

1. A method for attaching an integrated circuit die to a substrate, the method comprising:
   applying an adhesive in a pattern to at least one of a back surface of the die or an area of the substrate to which the die is to be attached;
   applying a viscous thermally conductive material to at least one of the back surface of the die or the area of the substrate to which the die is to be attached; and
   assembling, after applying the viscous thermally conductive material, the die and the substrate together by at least compressing and curing the adhesive and compressing the viscous thermally conductive material, wherein, when the adhesive is fully compressed and cured, the adhesive covers less than 25% by area of the back surface of the die, and wherein, when the viscous thermally conductive material is fully compressed, the viscous thermally conductive material fills at least part of the space between the die and the substrate.

2. The method of claim 1, wherein the adhesive covers less than 10% by area of the back surface of the die.

3. The method of claim 2, wherein the adhesive covers less than 5% by area of the back surface of the die.

4. The method of claim 1, wherein the adhesive is a thermally conductive adhesive.

5. The method of claim 1, wherein the adhesive pattern is at least one of:
  one dot of adhesive in a center region of the back surface or of the area of the substrate to which the die is to be attached;
  one dot of adhesive in each of two opposite corner regions of the back surface or of the area of the substrate to which the die is to be attached;
  one dot of adhesive in each of four corner regions of the back surface or of the area of the substrate to which the die is to be attached; or
  one or more lines of adhesive disposed along one or more edges of the back surface or of the area of the substrate to which the die is to be attached.

6. The method of claim 1, wherein the viscous thermally conductive material is at least one of a thermal grease, a thermal paste, one or more gap filler pads, thermal tape, a heat-transfer compound.

7. The method of claim of claim 1, wherein the die is a thermal imaging focal plane array (FPA).

8. A device comprising an integrated circuit die attached to a substrate, the device produced by at least:
  applying an adhesive in a pattern to at least one of a back surface of the die or an area of the substrate to which the die is to be attached;
  applying a viscous thermally conductive material to at least one of the back surface of the die or the area of the substrate to which the die is to be attached; and
  assembling, after applying the viscous thermally conductive material, the die and the substrate together by at least compressing and curing the adhesive and compressing the viscous thermally conductive material,
  wherein, when the adhesive is fully compressed and cured, the adhesive covers less than 25% by area of the back surface of the die, and
  wherein, when the viscous thermally conductive material is fully compressed, the viscous thermally conductive material fills at least part of the space between the die and the substrate.

9. The device of claim 8, wherein the adhesive covers less than 10% by area of the back surface of the die.

10. The device of claim 9, wherein the adhesive covers less than 5% by area of the back surface of the die.

11. The device of claim of claim 8, wherein the adhesive is a thermally conductive adhesive.

12. The device of claim 8, wherein the adhesive pattern is at least one of:
  one dot of adhesive in a center region of the back surface or of the area of the substrate to which the die is to be attached;
  one dot of adhesive in each of two opposite corner regions of the back surface or of the area of the substrate to which the die is to be attached;
  one dot of adhesive in each of four corner regions of the back surface or of the area of the substrate to which the die is to be attached; or
  one or more lines of adhesive disposed along one or more edges of the back surface or of the area of the substrate to which the die is to be attached.

13. The device of claim 8, wherein the viscous thermally conductive material is a thermal grease.

14. The device of claim 8, wherein the die is a thermal imaging focal plane array (FPA).

15. An imaging device comprising:
  a substrate;
  a focal plane array (FPA) die;
  a cured adhesive adhering the FPA die to the substrate, the cured adhesive disposed between the substrate and the FPA die; and
  a viscous, thermally conductive, non-adhesive material disposed within at least a portion of a space between the FPA die and the substrate not occupied by the cured adhesive,
  wherein the cured adhesive covers less than 25% of a substrate-facing surface of the FPA die.

16. The imaging device of claim 15, wherein the cured adhesive covers less than 5% of the substrate-facing surface of the FPA die.

17. The imaging device of claim 15, wherein the cured adhesive is disposed in a pattern comprising one or more dots.

* * * * *